US007013319B1

(12) United States Patent
Gentile

(10) Patent No.: US 7,013,319 B1
(45) Date of Patent: Mar. 14, 2006

(54) DIGITAL FILTER METHODS AND STRUCTURES FOR INCREASED PROCESSING RATES

(75) Inventor: Ken Gentile, Bahama, NC (US)

(73) Assignee: Analog Devices, Inc., Norwood, MA (US)

( * ) Notice: Subject to any disclaimer, the term of this patent is extended or adjusted under 35 U.S.C. 154(b) by 718 days.

(21) Appl. No.: 09/989,283

(22) Filed: Nov. 20, 2001

(51) Int. Cl.
*G06F 17/10* (2006.01)

(52) U.S. Cl. ....................................... 708/319; 708/315

(58) Field of Classification Search ................ 708/319, 708/315
See application file for complete search history.

(56) References Cited

U.S. PATENT DOCUMENTS 5,777,912 A 7/1998 Leung et al.
5,831,879 A * 11/1998 Yom et al. .................. 708/301
6,182,103 B1 1/2001 Zierhofer
6,260,053 B1 7/2001 Maulik et al.
6,529,926 B1 * 3/2003 Capofreddi ................. 708/316
6,553,398 B1 * 4/2003 Capofreddi ................. 708/319
2002/0152250 A1 * 10/2002 Staszewski ................. 708/319

* cited by examiner

*Primary Examiner*—D. H. Malzahn
(74) *Attorney, Agent, or Firm*—Koppel, Jacobs, Patrick & Heybl

(57) ABSTRACT

Digital filters are provided that include a converter and a data processor. The converter converts successive strings of M successive data elements that occur at a system rate $F_s$ in an input data stream $D_{in}$ to M parallel data elements that respectively occur at a substream rate $F_s/M$ in M data substreams $D_{sbstrm}$. At a reduced substream rate $F_s/M$, the processor generates M convolutions of the filter's quantized impulse response with the M data substreams wherein each of the convolutions is arranged to generate a different one of M successive filtered output signals. Because the convolutions are conducted at the reduced substream rate $F_s/M$, the filters can operate at increased system rates. Preferably, the digital filter also includes a multiplexer that selects, at the system rate $F_s$, the M filtered output signals in successive order to thereby form a filtered output data stream $D_{out}$.

7 Claims, 5 Drawing Sheets

DIGITAL FILTER METHODS AND STRUCTURES FOR INCREASED PROCESSING RATES

BACKGROUND OF THE INVENTION

1. Field of the Invention

The present invention relates generally to digital filters.

2. Description of the Related Art

Digital filtering is a powerful engineering tool that is typically realized with digital signal processors (DSPs). In contrast to analog filters which generate filter errors for a variety of hardware-associated reasons (e.g., component fluctuations over time and temperature in passive filters and operational amplifier drift in active filters), digital filters virtually eliminate filter errors and are capable of performance specifications that are difficult to achieve with an analog implementation.

Analog filter design is directed to frequency domain multiplication of an input signal spectrum by the filter's transfer function. In contrast, digital filter design is carried out in the time domain with the equivalent process of convolving a quantized input signal with the filter's quantized impulse response. Digital filters, therefore, are generally associated with sampled data systems in which an input signal and the filter's impulse response are quantized in time and amplitude to provide discrete samples. The quantized input signal samples are provided by the system (e.g., by an analog-to-digital converter) and the impulse response samples (referred to as the filter's coefficients) are generally stored in memory.

An exemplary digital filter design initially establishes a desired frequency response, then determines the equivalent impulse response and finally quantizes this impulse response to find the filter coefficients. If the impulse response is time limited, the resulting digital filter is referred to as a finite impulse response (FIR) filter. Infinite impulse response (IIR) filters, in contrast, are recursive in form (i.e., they involve feedback) and their impulse response extends for an infinite time period. Although they can generally be realized with fewer operations, IIR filters typically do not match the filter performance of FIR filters (e.g., they cannot be designed to realize a linear phase response).

As stated above, digital filters convolve a quantized input signal with the filter's quantized impulse response. If quantized samples of an input data stream $D_{in}$ are expressed as x(n), the convolution is given by $$y(n)=\sum_{k=0}^{N-1} a_k x(n-k) \quad (1)$$

wherein $a_k$ are the filter coefficients, N is defined below with respect to FIG. 1 and the convolution generates quantized elements y(n) of the filter's output data stream $D_{out}$.

FIG. 1 illustrates an exemplary FIR filter structure 20 that realizes the convolution of equation (1). In this filter, an input data stream $D_{in}$ at an input port 22 is passed through a string of delay elements 24 (e.g., buffer registers) that are labeled $Z^{-1}$ to correspond to conventional z-transform delay element representation. Accordingly, the quantized input signals that travel along the string are shown as x(n), x(n−1) - - - x(n−5) to indicate their relative sample time in the input data stream $D_{in}$. These quantized input data elements are multiplied by corresponding filter coefficients $a_0$, $a_1$ - - - $a_5$ in respective multipliers 26 and the products summed in summers 28 to form quantized output signals y(n) in an output data stream $D_{out}$ at the filter's output port 30.

Digital filters are typically realized with DSPs that are programmed to perform the exemplary delays, multiplications and summations of FIG. 1. The filter structure associated with each filter coefficient is typically referred to as a filter "tap" and N in equation (1) defines the number of taps in the filter. For example, the digital filter 20 of FIG. 1 is a 5-tap filter.

If a DSP is realizing the processes of the digital filter 20 of FIG. 1, it receives input data elements x(n) at a system rate $F_s$ and must execute all process steps of the filter routine in each clock period $1/F_s$ if it is to maintain real-time operation. It is apparent from FIG. 1 that each tap requires a corresponding multiply-accumulate operation so that N multiply-accumulate operations (plus overhead operations) must be completed during each clock period $1/F_s$. Although DSPs are generally optimized to perform fast multiply-accumulate operations, the system rate $F_s$ is limited by the execution time of the processor and that it decreases as the number of taps N increases.

Therefore, the structure of the digital filter 20 of FIG. 1 imposes an upper bound on the operating frequency of a system that includes the filter. For example, it is presently difficult to realize complementary metal-oxide semiconductor (CMOS) digital filters that can operate at a 1 GHz system rate and such operation generally requires extensive pipelining structures in the filter's multipliers and summers.

BRIEF SUMMARY OF THE INVENTION

The present invention is directed to digital filter methods and structures that increase filter processing rates.

This goal is realized with digital filters that include a converter and a data processor. The converter converts successive strings of M successive data elements that occur at a system rate $F_s$ in an input data stream $D_{in}$ to M parallel data elements that respectively occur at a substream rate $F_s/M$ in M data substreams $D_{sbstrm}$.

At a reduced substream rate $F_s/M$, the processor generates M convolutions of the filter's quantized impulse response with the M data substreams wherein each of the convolutions is arranged to generate a different one of M successive filtered output signals. Because the convolutions are conducted at the reduced substream rate $F_s/M$, the filters can operate at increased system rates.

Preferably, the digital filter also includes a multiplexer that selects, at the system rate $F_s$, the M filtered output signals in successive order to thereby form a filtered output data stream $D_{out}$.

The novel features of the invention are set forth with particularity in the appended claims. The invention will be best understood from the following description when read in conjunction with the accompanying drawings.

DETAILED DESCRIPTION OF THE INVENTION

Figure 1:
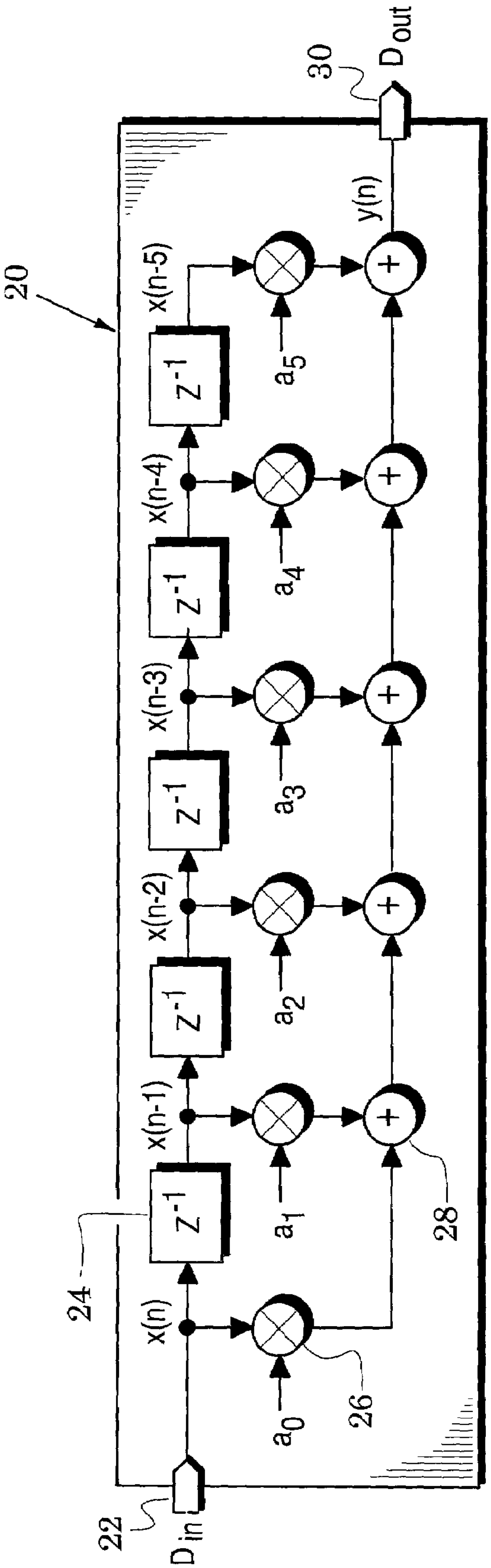
FIG. 1 is a block diagram that illustrates operational processes in a conventional digital filter.

The invention initially observes that an exemplary string of successive output data elements that occur at a system rate $F_s$ in the output data stream $D_{out}$ of the digital filter 20 of FIG. 1 has the convolution form of $$y(n)=a_0x(n)+a_1x(n-1)+a_2x(n-2)+a_3x(n-3)+a_4x(n-4)+a_5x(n-5)$$

$$y(n+1)=a_0x(n+1)+a_1x(n)+a_2x(n-1)+a_3x(n-2)+a_4x(n-3)+a_5x(n-4)$$

$$y(n+2)=a_0x(n+2)+a_1x(n+1)+a_2x(n)+a_3x(n-1)+a_4x(n-2)+a_5x(n-3)$$

$$y(n+3)=a_0x(n+3)+a_1x(n+2)+a_2x(n+1)+a_3x(n)+a_4x(n-1)+a_5x(n-2),$$

and that the multiply-accumulate operations of FIG. 1 must be executed within one clock period $1/F_s$ to realize each output element in this string.

In contrast, the invention provides digital filters which realize the same output data stream $D_{out}$ but whose process structures allocate a time $M/F_s$ for completion of similar convolutions wherein M is a selected integer which is at least two. Accordingly, digital filters of the invention are able to process input data streams $D_{in}$ at substantially greater operating rates.

Figure 2A:
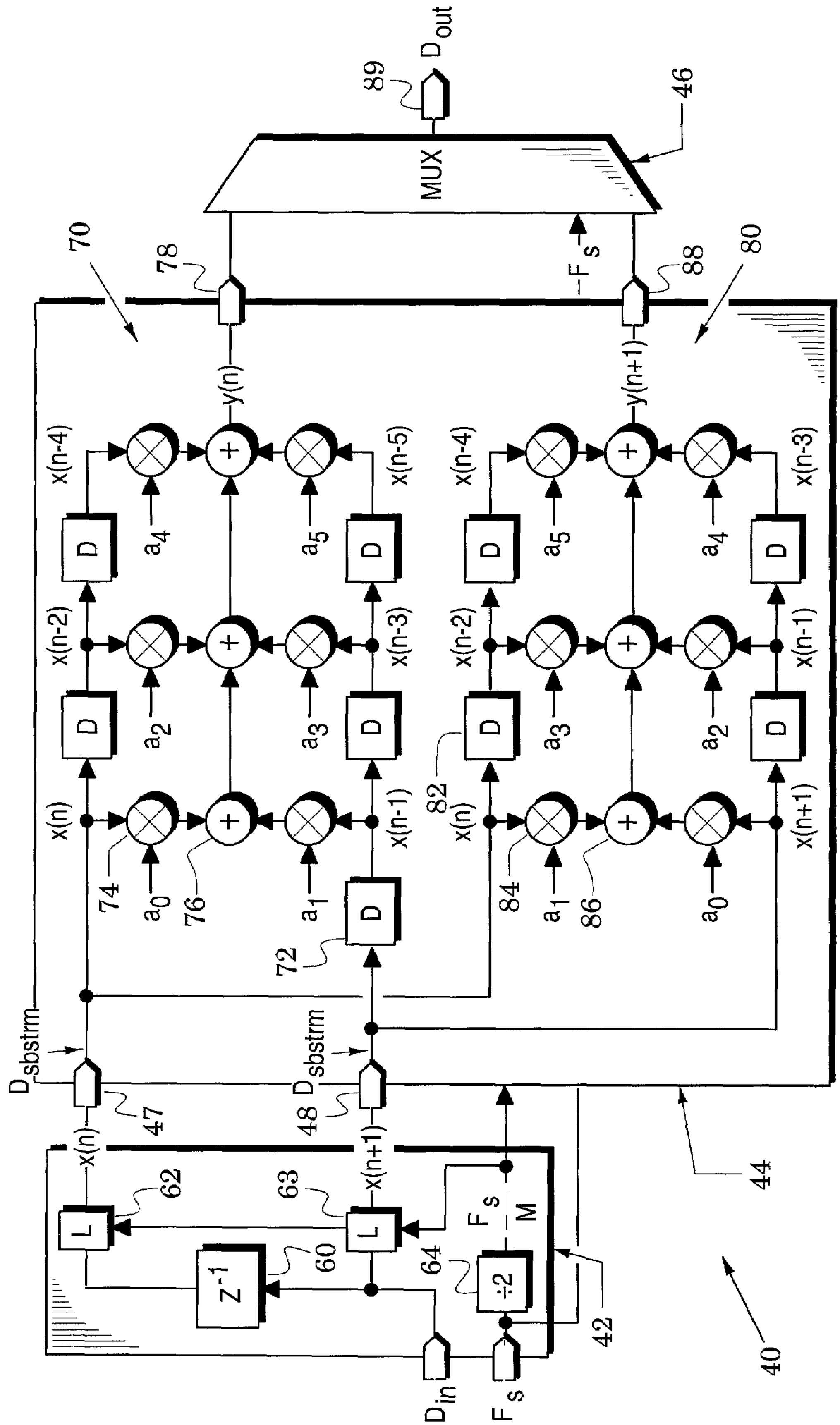
FIG. 2A is a block diagram that illustrates operational processes in a digital filter of the present invention.

In particular, the digital filter 40 of FIG. 2A includes a converter 42, a processor 44 and a multiplexer 46 and, for illustrative purposes, has been configured for an example in which M=2. In response to a system clock $F_s$ and an input data stream $D_{in}$, the converter 42 converts successive strings of M successive data elements in the input data stream $D_{in}$ to M parallel data elements that respectively occur at a substream rate $F_s/M$ in M data substreams $D_{sbstrm}$ which are indicated at the input ports 47 and 48 of the processor 44.

Figure 2B:
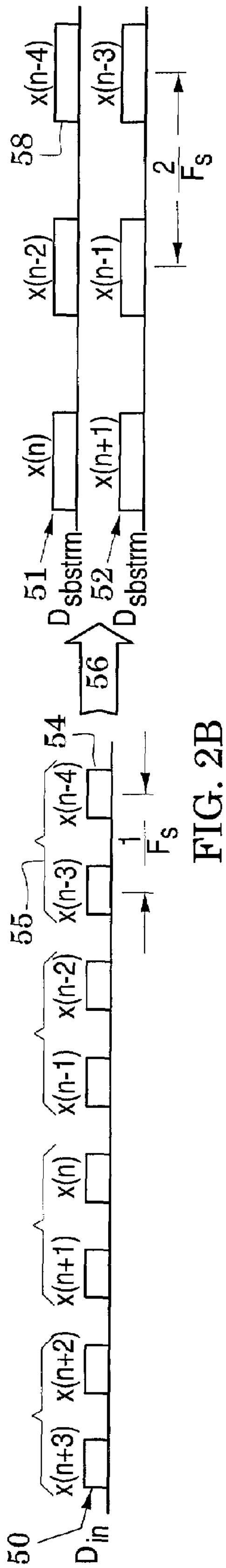
FIG. 2B is a timing diagram that illustrates the conversion of an input data stream $D_{in}$ to parallel data substreams $D_{sbstrm}$ in FIG. 2A.

An exemplary conversion process is shown in FIG. 2B in which an input data stream 50 is converted into two data substreams 51 and 52. The input data stream has successive input data elements 54 that occur at the system rate $F_s$ and can be considered to be organized in successive strings 55 of length M. As indicated by the conversion arrow 56, each string 55 is converted to M parallel data elements 58 which occur at the substream rate $F_s/M$. Accordingly, the output data elements 58 of each data substream $D_{sbstrm}$ are spaced by a time $M/F_s$ whereas the input data elements are spaced by the time $1/F_s$. In particular, FIG. 2 illustrates a conversion process in which M=2.

The conversion process of FIG. 2B is realized in the converter 42 of FIG. 2A with a delay element 60 (e.g., a buffer register) and a pair of latches 62 and 63. The input data stream $D_{in}$ is coupled to delay element 60 and to the lower latch 63. The delay element 60 inserts a delay of $1/F_s$ into the input data stream $D_{in}$ and thus provides a delayed version of the input data stream $D_{in}$ to the upper latch 62. In response to the system clock $F_s$, a divider 64 provides a reduced clock $F_s/2$ (more generally, a reduced clock $F_s/M$) to the latches 62 and 63. In response, the latches provide parallel data elements at the substream rate $F_s/2$. An exemplary pair of parallel data elements x(n+1) and x(n) (from FIG. 2A) are respectively shown at the processor input ports 48 and 47.

The processor 44 includes an upper convolver 70 which has delay elements 72 that insert delays $2/F_s$(more generally, delays $M/F_s$) into the data substreams $D_{sbstrm}$ that issue from the upper and lower input ports 47 and 48. The delays are arranged to convert the parallel data element x(n+1) into respective delayed data elements x(n−1), x(n−3), and x(n−5) and the parallel data element x(n) into respective delayed data elements x(n−2) and x(n−4).

The upper convolver 70 also includes multipliers 74 that multiply one of the parallel data elements (in this case, x(n)) and all of the delayed data elements by respective ones of filter coefficients $a_0$ - - - $a_5$ and the products are summed in summers 76 to provide a filtered output signal. In particular, the filter coefficients $a_0$ - - - $a_5$ are arranged so that the convolution of the convolver 70 generates the output data signal y(n) (whose convolved form was shown above) at a converter output port 78.

The processor 44 includes a similar lower convolver 80 which has delay elements 82 that insert delays $2/F_s$ into the data substreams $D_{sbstrm}$ at the upper and lower input ports 47 and 48. The delays are arranged to convert the parallel data element x(n+1) into respective delayed data elements x(n−1) and x(n−3) and the parallel data element x(n) into respective delayed data elements x(n−2) and x(n−4).

The lower convolver 80 also includes multipliers 84 that multiply both of the parallel data elements (in this case, x(n) and x(n+1)) and all of the delayed data elements by respective ones of filter coefficients $a_0$ - - - $a_5$ and the products are summed in summers 86 to provide a filtered output signal. In particular, the filter coefficients $a_0$ - - - $a_5$ are arranged so that the convolution of the convolver 80 generates the output data signal y(n+1) (whose convolved form was shown above) at a converter output port 88.

Finally, the multiplexer 46 responds to the system clock $F_5$ and selects the filtered output signals of the convolvers 70 and 80 in successive order to thereby form the filtered output data stream $D_{out}$. For example, the convolvers 70 and 80 successively provide, at a rate $F_s/2$, parallel output data signals y(n) and y(n+1) and parallel output data signals y(n+2) and y(n+3) and the mulitplexer selects, at a rate $F_s$, the parallel data elements in successive order y(n), y(n+1), y(n+2) and y(n+3) to generate the filtered output data stream $D_{out}$ at the filter output port 89.

Figure 3:
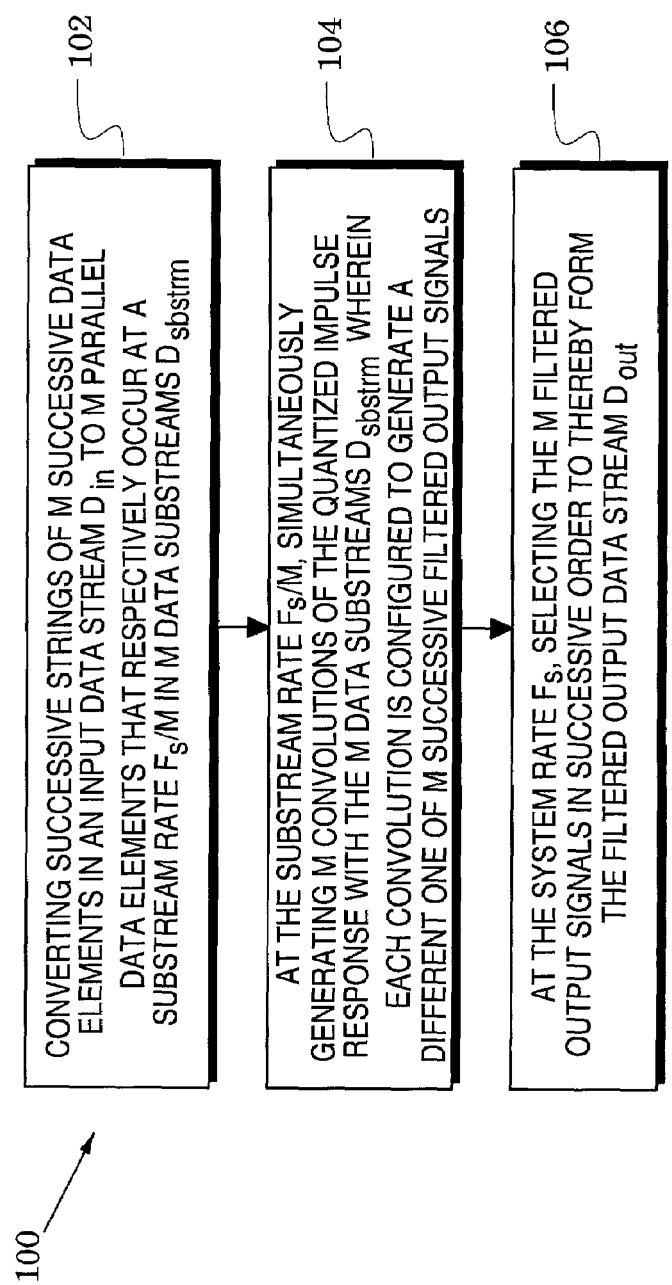
FIG. 3 is a flow chart that recites process steps in the digital filter of FIG. 2A.

The flow chart 100 of FIG. 3 summarizes the processes of the digital filter 40 of FIG. 2A that responds to an input data stream $D_{in}$ in which data samples occur at a system rate $F_s$. In a first process step 102, successive strings of M successive data elements in an input data stream $D_{in}$ are converted to M parallel data elements that respectively occur at a substream rate $F_s/M$ in M data substreams $D_{sbstrm}$. Process step 104 then generates, at the substream rate $F_s/M$, M convolutions of the filter's quantized impulse response with the M data substreams wherein each of the convolutions is configured to generate a different one of M successive filtered output signals. In process step 106, the M filtered output signals are selected, at the system rate $F_s$, in successive order to thereby form the filtered output data stream $D_{out}$. Preferably, the convolutions of step 104 are generated simultaneously.

The detailed process steps that are realized by the processor 40 of FIG. 2A begin by performing, at the substream rate $F_s/M$, the steps of:

a) delaying each of the M parallel data elements with delays of $M/F_s$ to generate a plurality of respective delayed data elements;

b) multiplying the delayed data elements and at least one selected parallel data element by selected coefficients of the quantized impulse response; and c) summing products generated in the multiplying step.

The multiplying step b) is accompanied by a step of appropriately choosing the selected parallel data element and the selected coefficient to generate one of the M successive filtered output signals. Finally, M variants (i.e. those of convolvers 70 and 80) of the performing and choosing steps are simultaneously executed to generate all of the M successive filtered output signals (e.g., x(n) and x(n+1)).

The invention notes that delayed data elements (e.g., x(n−1) and x(n−3)) are generated in each of the convolvers 70 and 80 of FIG. 2A. Accordingly, this duplication of resources can be eliminated by realizing the delaying step a) once only and then simultaneously executing variants of the multiplying step b), summing step c) and the choosing step.

The later process embodiment is illustrated by the processor 144 of FIG. 4 which is similar to the processor 44 of FIG. 2A with like elements indicated by like reference numbers. For example, the processor 144 includes the upper convolver 70 of FIG. 2A with its delay elements 72, multipliers 74 and summers 76. In contrast, however, the processor 144 substitutes a convolver 150 for the lower convolver 80 of FIG. 2A. The convolver 150 duplicates the multipliers 84 and summers 86 of FIG. 2A but eliminates the delay elements 82. Instead, the multipliers 84 are coupled to receive the parallel data elements and delayed data elements that are generated in the upper convolver 70.

Figure 5:
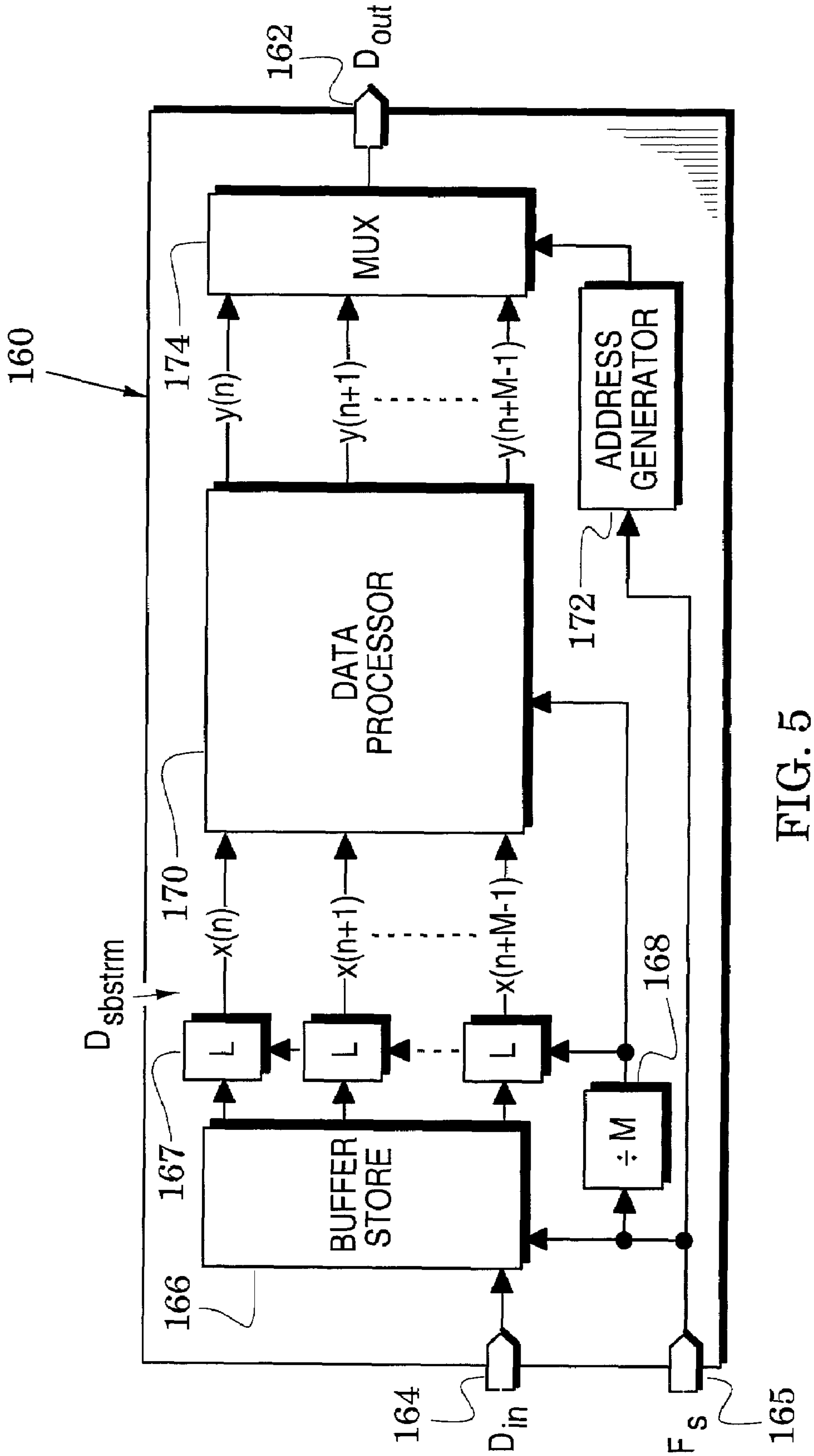
FIG. 5 is a block diagram that illustrates a structural embodiment for realizing the digital filters of the present invention.

FIG. 5 illustrates an exemplary digital filter realization 160 which generates an output data stream $D_{out}$ at an output port 162 in response to an input data stream $D_{in}$ at an input port 164 and a system clock $F_s$ at a clock port 165.

The digital filter 160 includes a buffer store 166, latches 167, a clock divider 168, a processor 170, an address generator 172 and a multiplexer 174. The buffer store 166 converts successive strings of M successive data elements in the input data stream $D_{in}$ to M parallel data elements that are then latched in the latches 167 at a substream rate $F_s/M$ in M data substreams $D_{sbstrm}$. The data substreams $D_{sbstrm}$ provide parallel data elements x(n), x(n+1) - - - x(n+M−1) to the processor 170 and, in response, the processor generates filtered output data signals y(n), y(n+1) - - - y(n+M−1).

In particular, the processor 170 generates M convolutions of the filter's quantized impulse response with the M data substreams and each of the convolutions is configured to generate a different one of M successive filtered output signals. The address generator 172 provides addresses to the multilplexer 174 so that it selects, at the system rate FS, the M filtered output signals in successive order to thereby form the filtered output data stream $D_{out}$. Preferably, the M convolutions are generated simultaneously.

The processor 170 may be realized with one or more data processors that each have a programmable data path. In this embodiment of the invention, each processor's data path generally includes elements such as registers, memories, an accumulator, data buses, instruction buses and address generators and the data path is programmed to perform a respective one of the M convolutions of the filter's quantized impulse response with the M data substreams. Alternatively, the processor 170 may be realized with M fixed data paths that are each formed with digital registers, multipliers and summers that are permanently arranged to execute a respective one of the M convolutions of the filter's quantized impulse response with the M data substreams.

Figure 4:
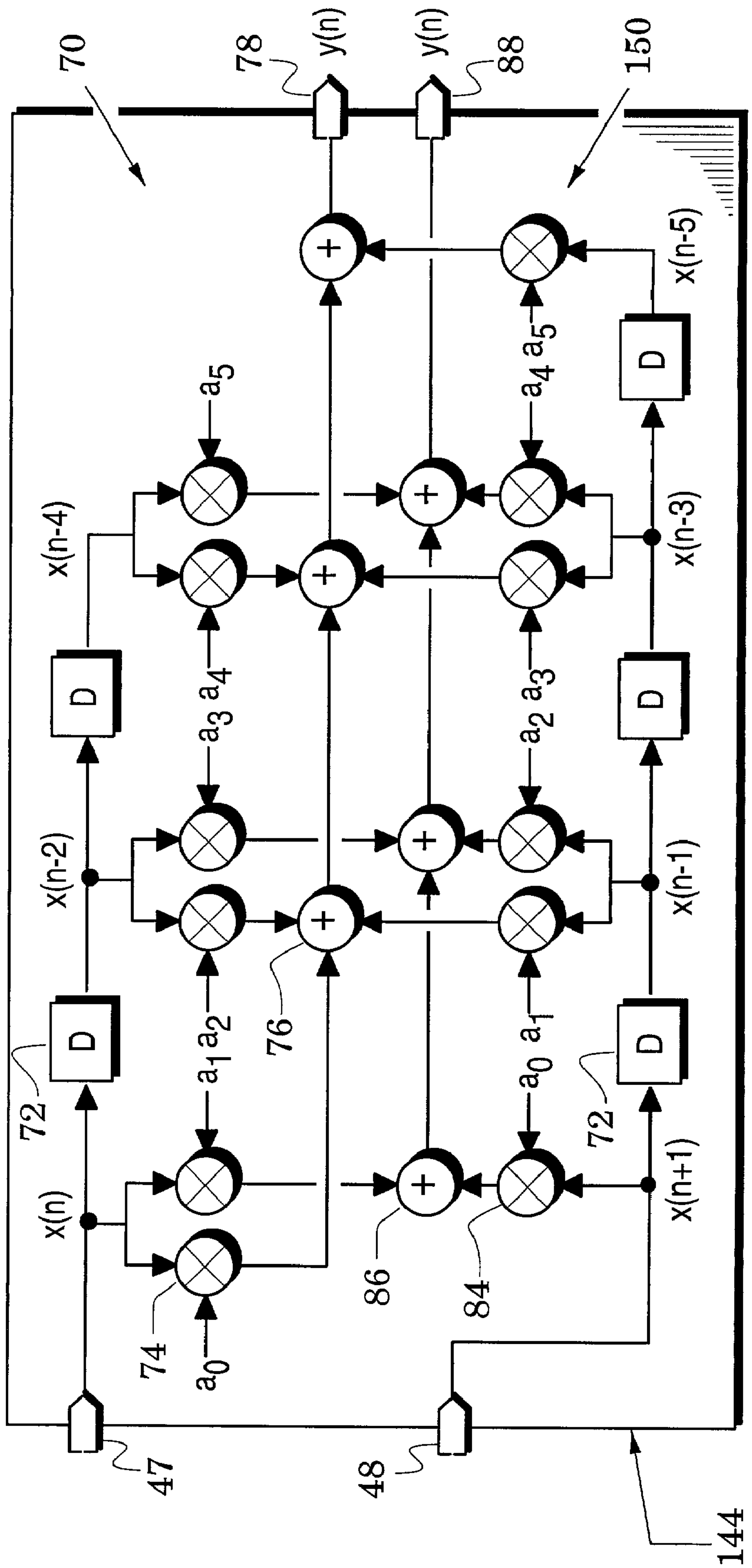
FIG. 4 is a block diagram that illustrates operational processes in another digital filter of the present invention.

Although FIGS. 2A and 4 illustrate specific filter embodiments in which M=2, other embodiments can be similarly configured for filters in which M>2. If M=3, for example, the processor 44 of FIG. 2A includes three convolvers that respectively process parallel data elements x(n), x(n+1) and x(n+2).

Digital filters of the invention convert, at a system rate $F_s$, an input data stream $D_{in}$ to M parallel data substreams and generate, at a substream rate $F_s/M$, M convolutions of the filter's quantized impulse response with the M data substreams. Because the convolutions are conducted at the reduced substream rate $F_s/M$, the filters can operate at increased system rates.

For example, it was remarked in the background of the invention that it is presently difficult to realize CMOS digital filters that can operate at a 1 GHz system rate and such operation generally requires extensive pipelining structures in the filter's multipliers and summers. Because the filters of the invention substantially reduce the filter's convolving rate, they significantly increase the realizable system rate.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A digital filter, comprising:

a divider that responds to an input clock signal that has an input rate and provides a reduced clock signal that has a reduced rate;

at least one buffer register that receives an input data stream of data elements and provides a delayed data stream;

at least two latches arranged to receive respective ones of said input and delayed data streams and provide latched data substreams in response to said reduced clock signal; and at least two convolvers that each receive said data substreams wherein each convolver includes:

a) buffer registers that receive and successively delay data elements of said data substreams;

b) digital multipliers arranged to multiply received data elements and data elements from said buffer registers with stored filter coefficients to thereby provide products; and c) digital summers that sum said products to generate an output data signal.

2. The filter of claim 1, further including a multiplexer that receives output data signals from respective convolvers and, in response to said input clock signal, combines them into an output data stream.

3. A digital filter, comprising:

a divider that responds to an input clock signal that has an input rate and provides a reduced clock signal that has a reduced rate;

at least one buffer register that receives an input data stream of data elements and provides a delayed data stream;

at least two latches arranged to receive respective ones of said input and delayed data streams and provide data substreams in response to said reduced clock signal;

for each respective one of said data substreams, a set of buffer registers that receive and successively delay data elements of said respective data substream;

multipliers arranged to multiply received data elements and data elements from said buffer registers with stored filter coefficients to thereby provide products; and for each respective one of said data substreams a set of summers arranged to sum said products and thereby generate an output data signal.

4. The filter of claim 3, further including a multiplexer that receives each output data signal and, in response to said input clock signal, multiplexes all output data signals into an output data stream.

5. A digital filter, comprising:

a divider that responds to an input clock signal that has an input rate and provides a reduced clock signal that has a reduced rate;

a buffer store that receives an input data stream of data elements and provides at least one delayed data stream;

at least two latches arranged to receive respective ones of said input and delayed data streams and provide latched data substreams in response to said reduced clock signal; and at least one data processor programmed to convolve each of said data substreams with stored filter coefficients to thereby generate a respective one of output data signals.

6. The digital filter of claim 5, further including a multiplexer that receives said output data signals and, in response to said input clock signal, multiplexes them into an output data stream.

7. The digital filter of claim 5, wherein said processor is further programmed to receive and successively delay data elements of each of said data substreams, multiply received and delayed data elements with stored filter coefficients to provide products, and, for each of said data substreams, sum respective products to generate a respective one of said output data signals.

* * * * *